United States Patent
Hirata et al.

(10) Patent No.: US 11,534,890 B2
(45) Date of Patent: Dec. 27, 2022

(54) SIC INGOT FORMING METHOD

(71) Applicant: DISCO CORPORATION, Tokyo (JP)

(72) Inventors: Kazuya Hirata, Tokyo (JP); Toshiyuki Sakai, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 786 days.

(21) Appl. No.: 16/197,701

(22) Filed: Nov. 21, 2018

(65) Prior Publication Data
US 2019/0152019 A1    May 23, 2019

(30) Foreign Application Priority Data
Nov. 22, 2017 (JP) ............................. JP2017-224509

(51) Int. Cl.
| | | |
|---|---|---|
| B24B 49/12 | (2006.01) | |
| B24B 7/22 | (2006.01) | |
| C30B 29/36 | (2006.01) | |
| C30B 33/00 | (2006.01) | |
| C30B 33/06 | (2006.01) | |

(52) U.S. Cl.
CPC .............. *B24B 49/12* (2013.01); *B24B 7/228* (2013.01); *C30B 29/36* (2013.01); *C30B 33/00* (2013.01); *C30B 33/06* (2013.01)

(58) Field of Classification Search
CPC ......... B24B 49/12; B24B 49/00; B24B 7/228; B24B 7/00; B24B 7/22; B24B 7/12; B24B 37/04; B24B 37/042; B24B 37/10; B24B 37/005; C30B 29/36; C30B 33/00; C30B 33/06; B28D 5/00; B28D 5/0005; B28D 5/0064; Y10S 117/915

USPC ............................................................. 451/6
See application file for complete search history.

(56) References Cited

U.S. PATENT DOCUMENTS

| | | | |
|---|---|---|---|
| 3,805,458 A * | 4/1974 | Miller .................... | H01L 41/337 451/41 |
| 10,562,130 B1* | 2/2020 | Donofrio ................ | H01L 22/12 |
| 2004/0089023 A1* | 5/2004 | Hiraiwa .................. | G02B 1/02 65/30.1 |
| 2008/0318496 A1* | 12/2008 | Tanikella ................ | B24B 49/12 451/41 |
| 2011/0210342 A1* | 9/2011 | Sasaki .................... | H01L 29/045 257/77 |

(Continued)

FOREIGN PATENT DOCUMENTS

| | | |
|---|---|---|
| CN | 106738393 A * | 5/2017 |
| JP | 2010251638 A | 11/2010 |
| JP | 2016111143 A | 6/2016 |

*Primary Examiner* — Joel D Crandall
*Assistant Examiner* — Michael A Gump
(74) *Attorney, Agent, or Firm* — Greer Burns & Crain, Ltd.

(57) ABSTRACT

An SiC ingot forming method includes: a holding step of holding by a chuck table a cut section of a primitive SiC ingot cut from an SiC ingot growth base; a planarization step of grinding an end surface of the primitive SiC ingot held by the chuck table, to planarize the end surface; a c-plane detection step of detecting a c-plane of the primitive SiC ingot from the planarized end surface; a first end surface forming step of grinding the planarized end surface, to form a first end surface inclined at an off angle relative to the c-plane; and a second end surface forming step of holding the first end surface by the chuck table and grinding the cut section of the primitive SiC ingot in parallel to the first end surface, to form a second end surface.

14 Claims, 7 Drawing Sheets

(56) References Cited

U.S. PATENT DOCUMENTS

2013/0068157 A1* 3/2013 Sasaki ............... C23C 14/24
                                                117/84
2016/0193691 A1* 7/2016 Hirata ............... C30B 29/36
                                                225/2
2017/0151627 A1* 6/2017 Hirata ............... C30B 29/406

* cited by examiner

SIC INGOT FORMING METHOD

BACKGROUND OF THE INVENTION

Field of the Invention

The present invention relates to an SiC ingot forming method.

Description of the Related Art

A plurality of devices such as power devices and light emitting diodes (LEDs) are formed on a front side of a silicon carbide (SiC) wafer while being partitioned by a plurality of intersecting division lines. The circular disk-shaped SiC wafer is formed by slicing a cylindrical SiC ingot by a wire saw or the like, which is accompanied by a problem that the cutting margin due to the wire saw is comparatively large, and around 80% of the SiC ingot is disposed of as cutting swarf, leading to poor production efficiency (see, for example, Japanese Patent Laid-open No. 2010-251638).

In view of this problem, the present applicant has proposed a technology for enhancing the production efficiency, in which a laser beam of such a wavelength as to be transmitted through an SiC ingot is applied to the SiC ingot, with a focal point of the laser beam positioned at a depth corresponding to the thickness of the wafer to be formed, to form a modified layer in which SiC is separated into silicon (Si) and carbon (C) and a crack extends along a c-plane, and the wafer to be formed is exfoliated from the SiC ingot (see, for example, Japanese Patent Laid-open No. 2016-111143).

SUMMARY OF THE INVENTION

However, a method for efficiently forming an SiC ingot has not been established.

It is therefore an object of the present invention to provide a method for efficiently forming an SiC ingot.

In accordance with an aspect of the present invention, there is provided an SiC ingot forming method including: a holding step of holding by a chuck table a cut section of a primitive SiC ingot cut from an SiC ingot growth base; a planarization step of grinding an end surface of the primitive SiC ingot held by the chuck table, to planarize the end surface; a c-plane detection step of detecting a c-plane of the primitive SiC ingot from the planarized end surface; a first end surface forming step of grinding the planarized end surface, to form a first end surface inclined at an off angle relative to the c-plane; and a second end surface forming step of holding the first end surface by the chuck table and grinding the cut section of the primitive SiC ingot in parallel to the first end surface, to form a second end surface.

Preferably, in the c-plane detection step, a laser beam of such a wavelength as to be transmitted through SiC is applied to the primitive SiC ingot from the end surface planarized in the planarization step, with a focal point of the laser beam positioned inside the primitive SiC ingot, to form a modified layer in which SiC is separated into Si and C and a crack extends along the c-plane, and the modified layer is observed from the planarized end surface to detect the c-plane. Preferably, after the first end surface forming step, a peripheral surface of the primitive SiC ingot is formed with a first orientation flat parallel to a direction in which the off angle is formed, and with a second orientation flat orthogonal to the first orientation flat on a right side of the first orientation flat as the primitive SiC ingot is viewed from the first end surface side. Preferably, the second orientation flat is formed to be shorter than the first orientation flat.

According to the present invention, an SiC ingot can be efficiently formed from a primitive SiC ingot while suppressing the amount of the blank material disposed of.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
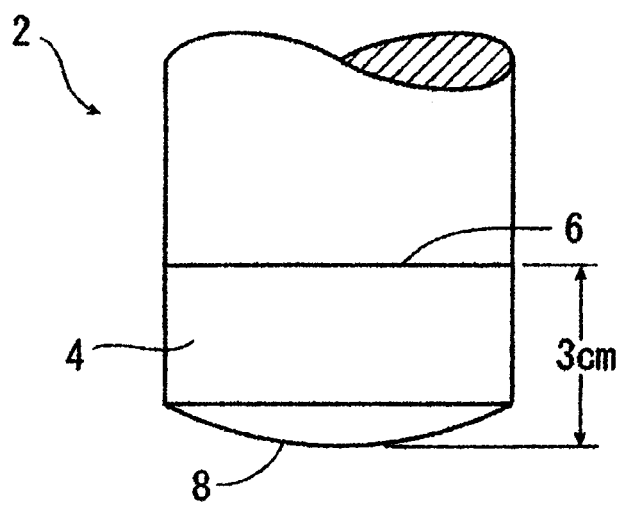
FIG. 1A is a front view of an SiC ingot growth base.
Figure 1B:
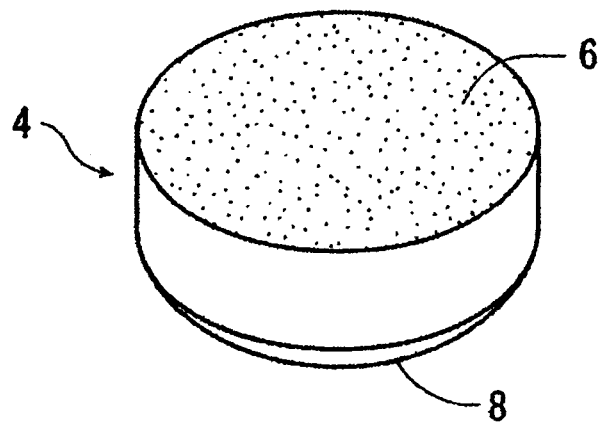
FIG. 1B is a perspective view of a primitive SiC ingot cut from the SiC ingot growth base.

An embodiment of an SiC ingot forming method according to the present invention will be described below, referring to the drawings. FIG. 1A illustrates an SiC ingot growth base 2 of a cylindrical hexagonal single crystal SiC grown from a silicon carbide (SiC) seed crystal by an appropriate crystal growth method. In the present embodiment, a cylindrical primitive SiC ingot 4 cut to an appropriate axial dimension (for example, approximately 3 cm) from the SiC ingot growth base 2 by a cutting apparatus such as a wire saw or an inner saw is used as a blank material for an SiC ingot to be formed. As depicted in FIG. 1B, the primitive SiC ingot 4 has a cut section 6 formed at the time of cutting from the SiC ingot growth base 2, and a growth end surface 8 formed at the time of crystal growth of the SiC ingot growth base 2. The cut section 6, which is an end surface on one side in regard of the axial direction, is flat as a whole but is rugged. The growth end surface 8, which is an end surface on the other side in regard of the axial direction, is domeshaped (hemispheric in shape) as a whole and is rugged. Note that the primitive SiC ingot to be subjected to the SiC ingot forming method of the present invention may have cut sections at end surfaces on both sides in regard of the axial direction.

Figure 2A:
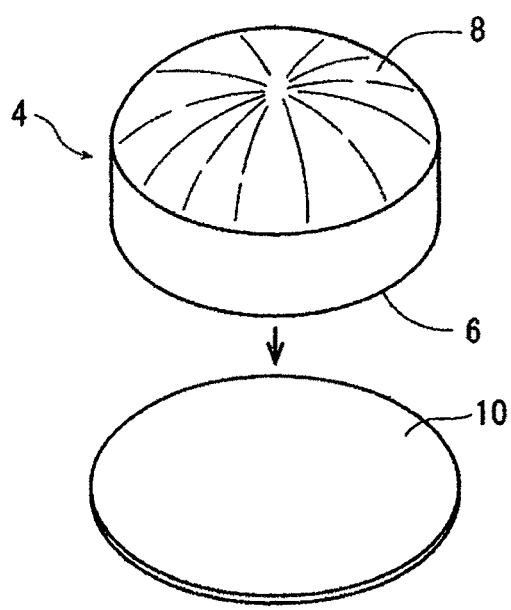
FIG. 2A is a perspective view of the primitive SiC ingot and a substrate.
Figure 2B:
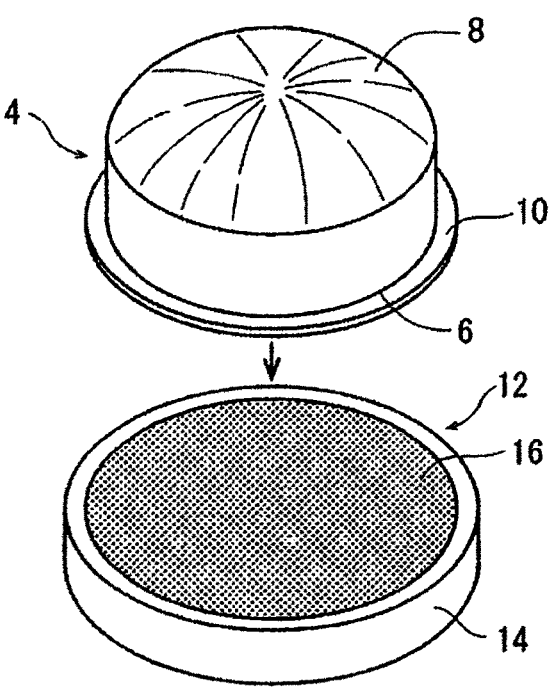
FIG. 2B is a perspective view of the primitive SiC ingot with the substrate mounted thereto and a chuck table.
Figure 2C:
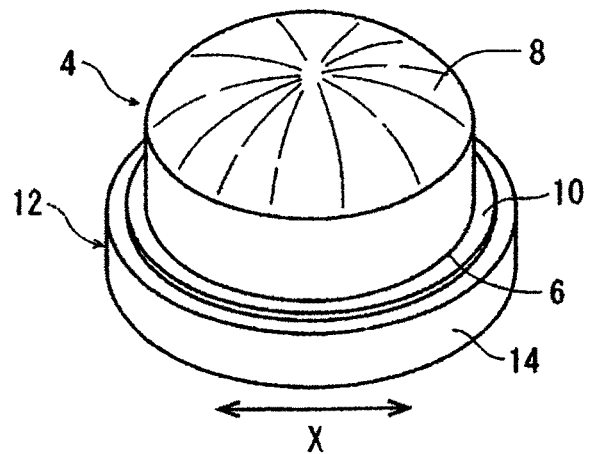
FIG. 2C is a perspective view depicting a state in which a holding step is performed.

In the present embodiment, first, a holding step is conducted in which the cut section 6 of the primitive SiC ingot 4 cut from the SiC ingot growth base 2 is held by a chuck table. Referring to FIG. 2A for description, in the holding step, first, a flat circular disk-shaped substrate 10 is mounted to the cut section 6 of the primitive SiC ingot 4 through an appropriate adhesive. The diameter of the substrate 10 is slightly greater than the diameter of the primitive SiC ingot 4. In addition, as depicted in FIGS. 2B and 2C, holding means 12 which can be used in the holding step is a circular chuck table 14 having a circular suction chuck 16 at an upper surface thereof. The chuck table 14 is configured to be rotated by rotating means (not depicted) about an axis extending in the vertical direction while passing through the radial center of the chuck table 14, and to be moved forward and backward by feeding means (not depicted) in an X-axis direction which is substantially horizontal and indicated by arrow X in FIG. 2C. The suction chuck 16, which is porous, is connected to suction means (not depicted), and the diameter of the suction chuck 16 is slightly smaller than the diameter of the substrate 10.

Referring to FIGS. 2B and 2C for continuing the description, in the holding step, after the substrate 10 is mounted to the cut section 6 of the primitive SiC ingot 4 as aforementioned, the primitive SiC ingot 4 is placed on the chuck table 14, with the substrate 10 directed to the lower side. At the time of placing the primitive SiC ingot 4 on the chuck table 14, the radial center of the primitive SiC ingot 4 and the radial center (rotational center) of the chuck table 14 are matched to each other. Next, the suction means connected to the suction chuck 16 is operated to generate a suction force at the upper surface of the suction chuck 16. By this, the substrate 10 can be attracted by suction with a predetermined suction force by the suction chuck 16, and the cut section 6 of the primitive SiC ingot 4 can be held by the chuck table 14 through the substrate 10. Note that the substrate 10 is mounted to the cut section 6 of the primitive SiC ingot 4 in the holding step, for the purpose of holding the rugged cut section 6 by the chuck table 14. Since the cut section 6 of the primitive SiC ingot 4 is rugged, the cut section 6 and the suction chuck 16 do not make close contact with each other, and, therefore, even when the suction means is operated, air would be sucked in through gaps generated between the cut section 6 and the suction chuck 16. It is therefore not possible to attract the cut section 6 by the suction chuck 16. In view of this, the substrate 10 being flat to such an extent as to be attracted by suction by the suction chuck 16 when the suction means is operated is mounted to the cut section 6 of the primitive SiC ingot 4, whereby the cut section 6 of the primitive SiC ingot 4 can be held by the chuck table 14 through the substrate 10.

Figure 3:
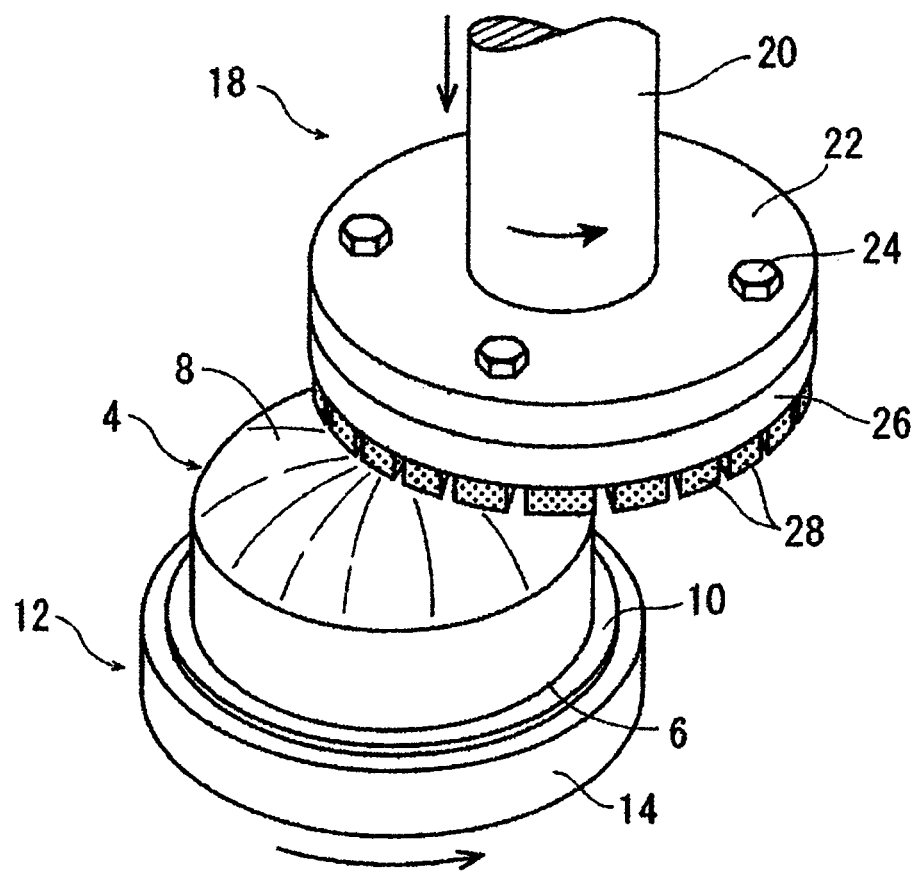
FIG. 3 is a perspective view depicting a state in which a planarization step is performed.

After the holding step is conducted, a planarization step is carried out in which an end surface (in the present embodiment, the growth end surface 8) of the primitive SiC ingot 4 held by the chuck table 14 is planarized by grinding. The planarization step is performed, for example, by use of a grinding apparatus 18 part of which is depicted in FIG. 3. The grinding apparatus 18 includes a cylindrical spindle 20 connected to a motor (not depicted) and extending in the vertical direction, and a circular disk-shaped wheel mount 22 fixed to a lower end of the spindle 20. An annular grinding wheel 26 is fixed to a lower surface of the wheel mount 22 by bolts 24. A plurality of grindstones 28 arranged in an annular pattern at intervals in the circumferential direction are fixed to an outer peripheral edge portion of a lower surface of the grinding wheel 26.

Referring to FIG. 3 for continuing the description, in the planarization step, first, the chuck table 14 holding the primitive SiC ingot 4 thereon is positioned at a position under the grindstones 28. In this instance, the rotational center of the chuck table 14 is deviated in relation to the rotational center of the grinding wheel 26 in such a manner that the grindstones 28 pass through the rotational center of the chuck table 14. Next, the chuck table 14 is rotated by the rotating means at a predetermined rotating speed (for example, 300 rpm) counterclockwise as viewed from above. In addition, the spindle 20 is rotated by the motor at a predetermined rotating speed (for example, 6,000 rpm) counterclockwise as viewed from above. Subsequently, the spindle 20 is lowered by lift means (not depicted) of the grinding apparatus 18, to bring the grindstones 28 into contact with the growth end surface 8 of the primitive SiC ingot 4. As aforementioned, the radial center of the primitive SiC ingot 4 and the rotational center of the chuck table 14 are matched to each other, and the rotational center of the chuck table 14 is deviated relative to the rotational center of the grinding wheel 26 such that the grindstones 28 pass through the rotational center of the chuck table 14; therefore, when the growth end surface 8 and the grindstones 28 make contact with each other while the chuck table 14 and the grinding wheel 26 are being rotated, the whole part of the growth end surface 8 is ground by the grindstones 28. After the grindstones 28 are put into contact with the growth end surface 8, the spindle 20 is lowered at a predetermined grinding feeding speed (for example, 0.1 μm/s). By this, the growth end surface 8 of the primitive SiC ingot 4 held by the chuck table 14 can be ground and thereby planarized.

Figure 4A:
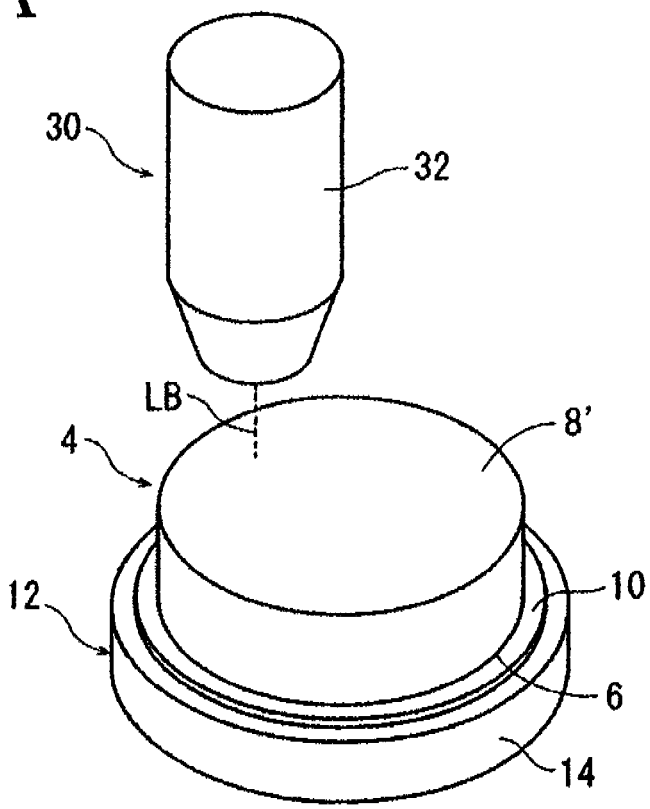
FIG. 4A is a perspective view depicting a state in which a modified layer is formed in the inside of the primitive SiC ingot in a c-plane detection step.

After the planarization step is performed, a c-plane detection step of detecting a c-plane ({0001} plane) of the primitive SiC ingot 4 from the planarized end surface is carried out. The c-plane detection step can be conducted, for example, by use of a laser processing apparatus 30 part of which is depicted in FIG. 4A. The laser processing apparatus 30 includes a laser oscillator (not depicted) adapted to emit a pulsed laser beam LB of such a wavelength as to be transmitted through SiC, and a focusing unit 32 adapted to focus the pulsed laser beam LB emitted by the laser oscillator to apply the pulsed laser beam LB to a workpiece. Note that in FIGS. 4A to 4C, an end surface obtained by planarization of the growth end surface 8 of the primitive SiC ingot 4 is denoted by reference symbol 8'.

Figure 4B:
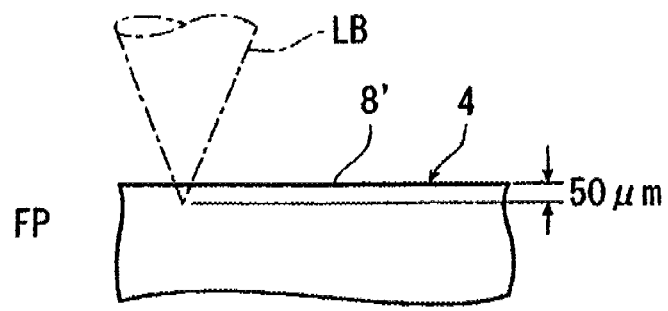
FIG. 4B is a front view depicting a state in which the modified layer is formed in the inside of the primitive SiC ingot in the c-plane detection step.
Figure 4C:
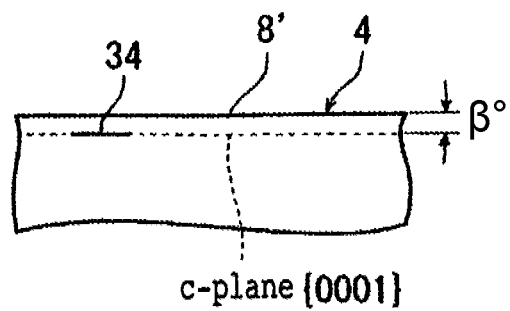
FIG. 4C is a front view of the primitive SiC ingot formed with the modified layer in the inside thereof.

In the c-plane detection step, first, as depicted in FIG. 4A, the chuck table 14 holding the primitive SiC ingot 4 thereon is positioned at a position under the focusing unit 32. Next, as depicted in FIG. 4B, a focal point FP of the pulsed laser beam LB is positioned from the planarized end surface 8' to a position in the inside of the primitive SiC ingot 4 by focal point position control means (not depicted). Subsequently, a pulsed laser beam LB of such a wavelength as to be transmitted through SiC is applied through the focusing unit 32 to the primitive SiC ingot 4. As a result, as depicted in FIG. 4C, SiC is separated into silicon (Si) and carbon (C) by application of the pulsed laser beam LB and a modified layer 34 in which a crack extends along the c-plane from the part where SiC is separated into Si and C is formed. Then, the modified layer 34 is observed from the planarized end surface 8' to detect the c-plane. Specifically, since the crack in the modified layer 34 extends along the c-plane, the depth of the crack extending from a single modified layer 34 from the planarized end surface 8' is measured at a plurality of locations, and the inclination angle and the inclination direction of the crack are detected, whereby the inclination angle and the inclination direction of the c-plane in relation to the planarized end surface 8' are detected.

In the present embodiment, as illustrated in FIG. 4C, the inclination angle of the c-plane relative to the planarized end surface 8' is 0.5 degrees. Note that for detecting the c-plane, it is sufficient to form a single modified layer 34, and, therefore, it is sufficient to apply a single shot of the pulsed laser beam LB to the primitive SiC ingot 4. However, it is difficult to apply only one shot of the pulsed laser beam LB to the primitive SiC ingot 4. For this reason, at the time of applying the pulsed laser beam LB to the primitive SiC ingot 4, the primitive SiC ingot 4 and the focal point FP may be relatively moved at an appropriate feeding speed, and a plurality of modified layers 34 may be formed inside the primitive SiC ingot 4. At the time of relatively moving the primitive SiC ingot 4 and the focal point FP, the chuck table 14 holding the primitive SiC ingot 4 thereon may be moved relative to the focal point FP by the above-mentioned feeding means, or the focusing unit 32 may be moved relative to the primitive SiC ingot 4 by appropriate moving means (not depicted). The c-plane detection step using the laser processing apparatus 30 as above may be carried out, for example, in the following processing conditions.

Figure 5A:
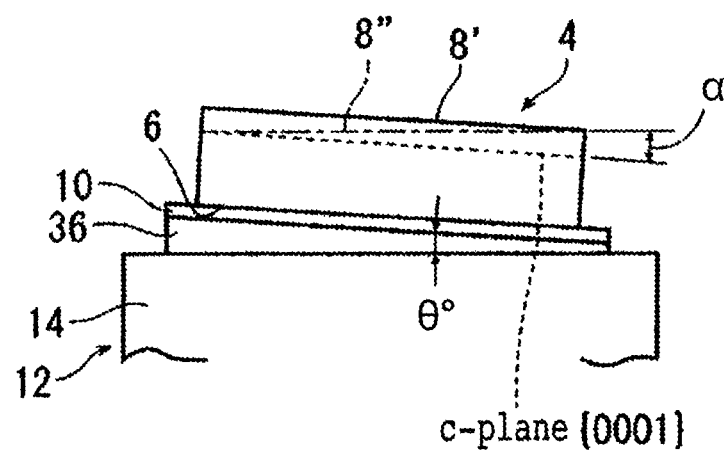
FIG. 5A is a front view depicting a state in which a wedge is disposed between the chuck table and the substrate.

Wavelength of pulsed laser beam: 1,064 nm
    Repetition frequency: 140 kHz
    Average output: 14 W
    Pulse width: 4 ns
    Diameter of focal point: 3 μm
    Numerical aperture (NA): 0.7
    Feeding speed: 765 mm/s
    Position of focal point: depth of 50 μm from planarized end surface After the c-plane detection step is performed, a first end surface forming step is carried out in which the planarized end surface 8' is ground to form a first end surface inclined at an off angle relative to the c-plane. The off angle formed by the first end surface to be formed and the c-plane may be appropriately set to 1 degree, 4 degrees, 6 degrees or the like; in the present embodiment, a case where the off angle is 4 degrees will be described. As aforementioned, in the present embodiment, the inclination angle of the c-plane relative to the planarized end surface 8' is 0.5 degrees. Therefore, in the first end surface forming step, first, as illustrated in FIG. 5A, a wedge 36 for inclining the planarized end surface 8' relative to an upper surface of the chuck table 14 by 3.5 degrees (angle θ), or the difference between the off angle α (4 degrees) and the inclination angle of the c-plane of 0.5 degrees (angle β of FIG. 4C), is disposed between the upper surface of the chuck table 14 and a lower surface of the substrate 10. This ensures that the upper surface of the chuck table 14 and the first end surface 8" to be formed are parallel to each other and that the off angle α formed by the first end surface 8" to be formed and the c-plane is 4 degrees. The first end surface 8" to be formed is set to be located on the side of the planarized end surface 8' and below the modified layer 34 formed in the c-plane detection step. At the time of disposing the wedge 36, first, the operation of the suction means connected to the suction chuck 16 is stopped, to release the suction force of the suction chuck 16, and the primitive SiC ingot 4 is detached from the chuck table 14. Next, a circular disk-shaped wedge 36 having an angle formed between an upper surface and a lower surface thereof of 3.5 degrees is attracted by suction by the suction chuck 16, and the wedge 36 and the substrate 10 are fixed through an appropriate adhesive.

Figure 5B:
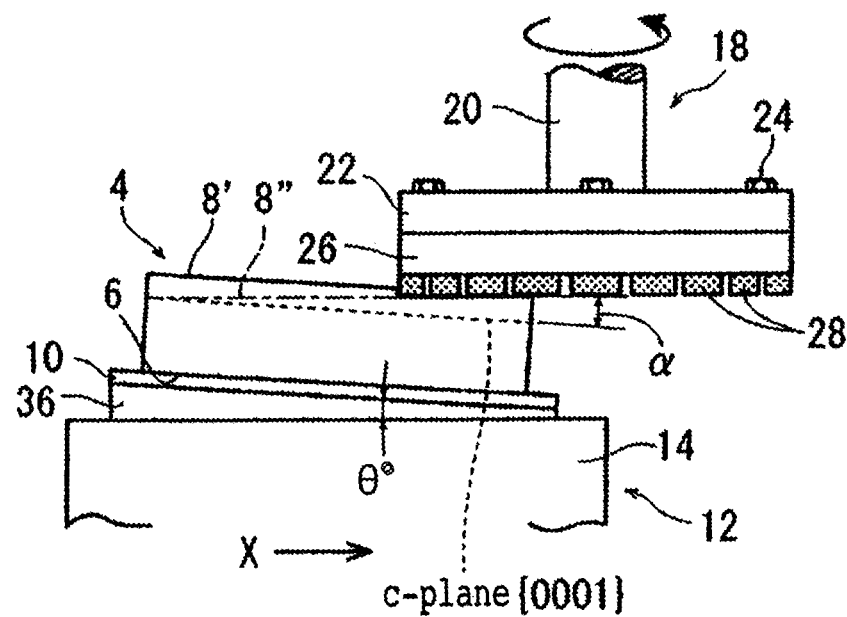
FIG. 5B is a front view depicting a state in which a first end surface forming step is performed.

Referring to FIG. 5B, the description of the first end surface forming step will be continued. After the wedge 36 is disposed, the planarized end surface 8' is ground, and this grinding can be performed using the aforementioned grinding apparatus 18. At the time of grinding the planarized end surface 8' by the grinding apparatus 18, first, the chuck table 14 holding the primitive SiC ingot 4 thereon is positioned at a position spaced in the X-axis direction from a position beneath the grinding apparatus 18. Next, the spindle 20 is lowered by the lift means of the grinding apparatus 18, and the vertical position of the first end surface 8" to be formed and the vertical position of the lower surfaces of the grindstones 28 are thereby matched to each other. Since the lower surfaces of the grindstones 28 and the upper surface of the chuck table 14 are set parallel to each other, the lower surfaces of the grindstones 28 and the first end surface 8" to be formed are parallel to each other. Next, the spindle 20 is rotated by the motor at a predetermined rotating speed (for example, 6,000 rpm) counterclockwise as viewed from above. Subsequently, the chuck table 14 is moved in the X-axis direction at an appropriate feeding speed by the feeding means, and the planarized end surface 8' is brought into contact with the grindstones 28. By this, the planarized end surface 8' can be ground, to form the flat first end surface 8" inclined at the off angle α (in the present embodiment, 4 degrees) relative to the c-plane. Note that at the time of forming the first end surface 8", like in the planarization step, the chuck table 14 holding the primitive SiC ingot 4 thereon may be rotated, and the grindstones 28 being rotated may be lowered toward the primitive SiC ingot 4, to grind the planarized end surface 8'.

Figure 6A:
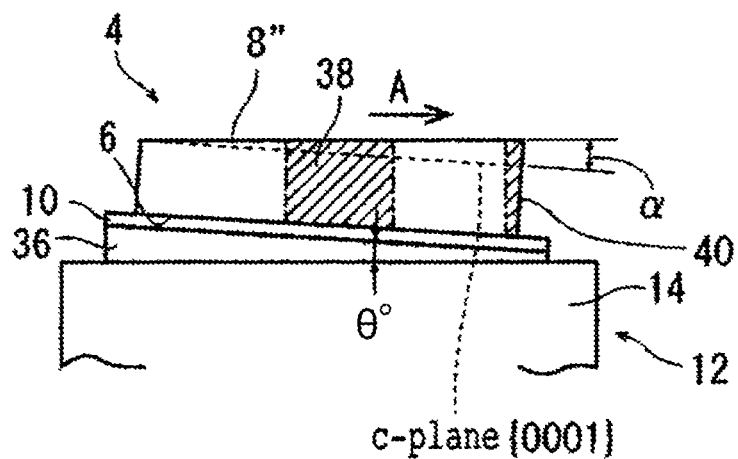
FIG. 6A is a front view of the primitive SiC ingot formed with first and second orientation flats.
Figure 6B:
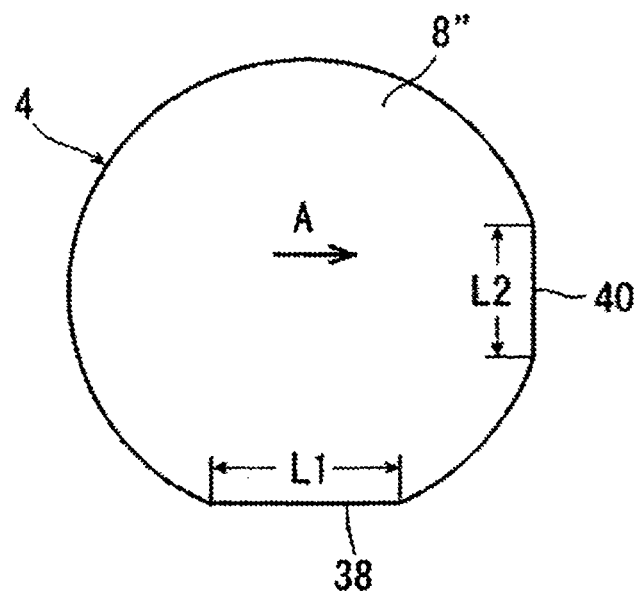
FIG. 6B is a plan view of the primitive SiC ingot formed with the first and second orientation flats.

In the present embodiment, after the first end surface forming step is performed, a first orientation flat and a second orientation flat, both rectangular in shape and indicative of the crystal orientation, are formed in the peripheral surface of the primitive SiC ingot 4. At the time of forming the first and second orientation flats, first, the suction force of the suction chuck 16 is released and the primitive SiC ingot 4 is detached from the chuck table 14, and the substrate 10 is detached from the primitive SiC ingot 4. Then, using a known grinding apparatus (not depicted) or a known cutting apparatus (not depicted), the first orientation flat 38 is formed in parallel to a direction A in which the off angle α is formed, and the second orientation flat 40 is formed on the right side of the first orientation flat 38, as the primitive SiC ingot 4 is viewed from the first end surface 8" side as depicted in FIGS. 6A and 6B. The second orientation flat 40 is formed in a direction orthogonal to the direction A in which the off angle α is formed, and, as viewed from above, the length L2 of the second orientation flat 40 is set shorter than the length L1 of the first orientation flat 38 (L2<L1).

In the present embodiment, after the first orientation flat 38 and the second orientation flat 40 are formed, a second end surface forming step is carried out in which the first end surface 8" is held by the chuck table 14, and the cut section 6 of the primitive SiC ingot 4 is ground in parallel to the first end surface 8", to form a second end surface. The second end surface forming step can be performed, for example, by use of the aforementioned grinding apparatus 18. In the second end surface forming step, first, the primitive SiC ingot 4 is placed on the chuck table 4 with the first end surface 8" faced down, and the suction force is generated at the upper surface of the suction chuck 16, to attract and hold the first end surface 8" by suction by the suction chuck 16. Next, the chuck table 14 holding the primitive SiC ingot 4 thereon is positioned at a position spaced in the X-axis direction from the position beneath the grinding apparatus 18. Subsequently, the spindle 20 is lowered by the lift means of the grinding apparatus 18, and the vertical position of a second end surface 6' to be formed and the vertical position of the lower surfaces of the grindstones 28 are thereby matched to each other. Next, the spindle 20 is rotated by the motor at a predetermined rotating speed (for example, 6,000 rpm) counterclockwise as viewed from above. Subsequently, the chuck table 14 is moved in the X-axis direction at an appropriate feeding speed by the feeding means, and the cut section 6 of the primitive SiC ingot 4 is brought into contact with the grindstones 28. By this, the cut section 6 can be ground in parallel to the first end surface 8", to form a flat second end surface 6'.

Figure 7A:
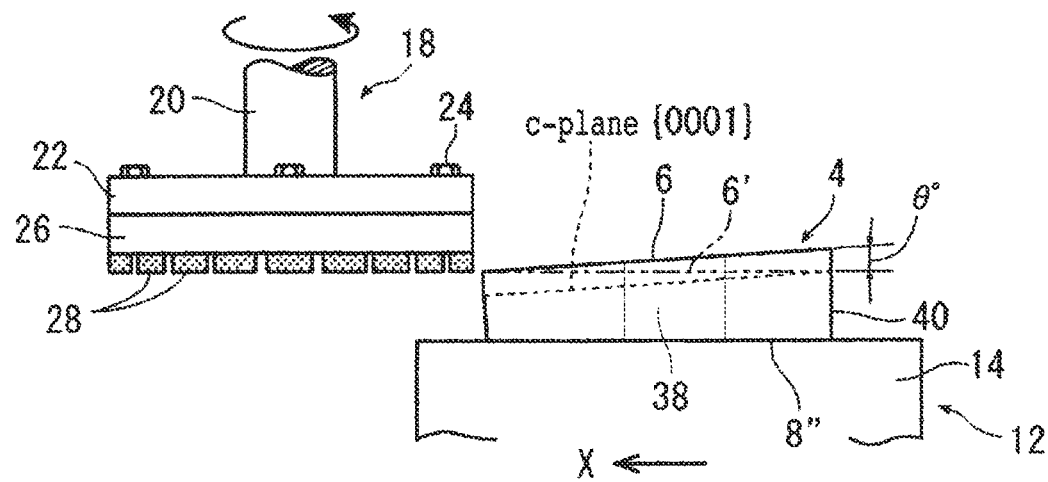
FIG. 7A is a front view depicting a state in which a second end surface forming step is performed.
Figure 7B:
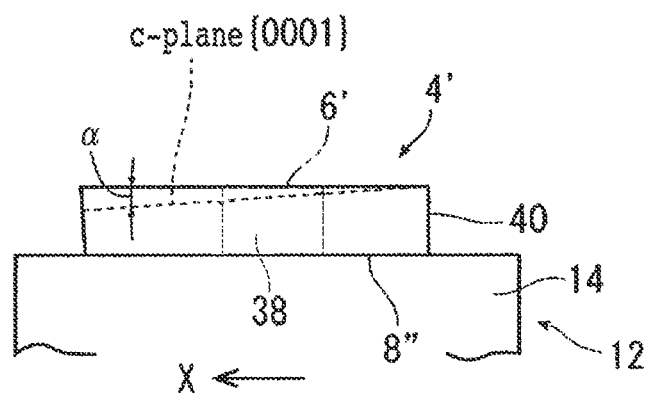
FIG. 7B is a front view of an SiC ingot.
Figure 7C:
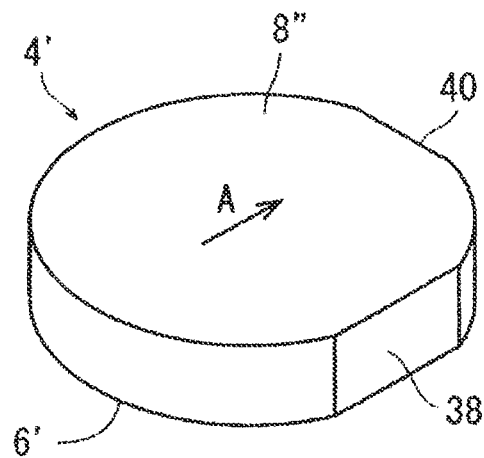
FIG. 7C is a perspective view of the SiC ingot.

In this way, as depicted in FIG. 7C, an SiC ingot 4' can be formed which has the first end surface 8" inclined at the off angle α (in the present embodiment, 4 degrees) relative to the c-plane, the second end surface 6' parallel to the first end surface 8", and the first orientation flat 38 and the second orientation flat 40, both indicative of the crystal orientation. Note that at the time of forming the second end surface 6', like in the planarization step and the first end surface forming step, the chuck table 14 holding the primitive SiC ingot 4 thereon may be rotated, and the grindstones 28 being rotated may be lowered toward the primitive SiC ingot 4, to grind the cut section 6.

As above-mentioned, the present embodiment includes the holding step of holding by the chuck table 14 the cut section 6 of the primitive SiC ingot 4 cut from the SiC ingot growth base 2, the planarization step of grinding the growth end surface 8 of the primitive SiC ingot 4 held by the chuck table 14 to planarize the growth end surface 8, the c-plane detection step of detecting the c-plane of the primitive SiC ingot 4 from the planarized end surface 8', the first end surface forming step of grinding the planarized end surface 8' to form the first end surface 8" inclined at the off angle α relative to the c-plane, and the second end surface forming step of holding the first end surface 8" by the chuck table 14 and grinding the cut section 6 of the primitive SiC ingot 4 in parallel to the first end surface 8" to form the second end surface 6'. Therefore, the SiC ingot 4' can be efficiently formed from the primitive SiC ingot 4, while suppressing the amount of the blank material disposed of by grinding or the like.

Note that while with respect to the first end surface forming step, an example in which the wedge 36 is disposed between the upper surface of the chuck table 14 and the lower surface of the substrate 10 has been described in the present embodiment, a method may be adopted in which the wedge 36 is not used and, instead, the chuck table 14 holding the primitive SiC ingot 4 thereon is inclined by an amount corresponding to the angle of the wedge 36. In addition, the known Laue method may be used in the c-plane detection step.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A silicon carbide (SiC) ingot forming method comprising:
   a holding step of holding by a chuck table a cut section of a primitive SiC ingot cut from an SiC ingot growth base;
   a planarization step of grinding an end surface of the primitive SiC ingot held by the chuck table, to planarize the end surface;
   a c-plane detection step of detecting a c-plane of the primitive SiC ingot from the planarized end surface;
   a first end surface forming step of grinding the planarized end surface, to form a first end surface inclined at an off angle relative to the c-plane; and
   a second end surface forming step of holding the first end surface by the chuck table and grinding the cut section of the primitive SiC ingot in parallel to the first end surface, to form a second end surface, and
   wherein in the c-plane detection step, a laser beam of such a wavelength as to be transmitted through SiC is applied to the primitive SiC ingot from the end surface planarized in the planarization step, with a focal point of the laser beam positioned inside the primitive SiC ingot, to form a modified layer in which SiC is separated into silicon (Si) and carbon (C) and a crack extends along the c-plane, and the modified layer is observed from the planarized end surface to detect the c-plane, and
   further wherein the observing of the modified layer also includes measuring a depth of the crack extending along the c-plane, with respect to the planarized end surface, at a plurality of locations to detect an inclination angle and inclination direction of the c-plane.

2. The SiC ingot forming method according to claim 1, wherein after the first end surface forming step, a peripheral surface of the primitive SiC ingot is formed with a first orientation flat parallel to a direction in which the off angle is formed, and with a second orientation flat orthogonal to the first orientation flat on a right side of the first orientation flat as the primitive SiC ingot is viewed from the first end surface side.

3. The SiC ingot forming method according to claim 2, wherein the second orientation flat is formed to be shorter than the first orientation flat.

4. The SiC forming method of claim 1, further comprising:
   a determining the difference step of determining the difference between a predetermined angle relative to the c-plane and the inclination angle of the c-plane determined in the c-plane detection step, wherein the determining the difference step is performed after the c-plane detection step; and
   a wedge inserting step of inserting a wedge between the primitive SiC ingot and the chuck table, wherein the wedge includes an upper surface and a lower surface, and an angle defined between the upper surface and the lower surface is equal to the difference determined in the determining the difference step, and further wherein the wedge inserting step is performed between the determining the difference step and the first end surface forming step.

5. The SiC ingot forming method according to claim 4, wherein said predetermined angle is 1°.

6. The SiC ingot forming method according to claim 4, wherein said predetermined angle is 4°.

7. The SiC ingot forming method according to claim 4, wherein said predetermined angle is 6°.

8. A silicon carbide (SiC) ingot forming method comprising:
   a holding step of holding by a chuck table a cut section of a primitive SiC ingot cut from an SiC ingot growth base;

a planarization step of grinding an end surface of the primitive SiC ingot held by the chuck table, to planarize the end surface;

a c-plane detection step of detecting a c-plane of the primitive SiC ingot from the planarized end surface and determining an inclination angle of the c-plane;

a determining the difference step of determining the difference between a predetermined off angle relative to the c-plane and the inclination angle of the c-plane determined in the c-plane detection step;

a first end surface forming step of grinding the planarized end surface to form a first end surface inclined at the predetermined off angle relative to the c-plane; and a second end surface forming step of holding the first end surface by the chuck table and grinding the cut section of the primitive SiC ingot in parallel to the first end surface, to form a second end surface, and wherein the method further comprises:

a wedge inserting step of inserting a wedge between the primitive SiC ingot and the chuck table, wherein the wedge includes an upper surface and a lower surface, and an angle defined between the upper surface and the lower surface is equal to the difference determined in the determining the difference step; and wherein the wedge inserting step is performed between the determining the difference step and the first end surface forming step.

9. The SiC ingot forming method according to claim 8, wherein in the c-plane detection step, a laser beam of such a wavelength as to be transmitted through SiC is applied to the primitive SiC ingot from the end surface planarized in the planarization step, with a focal point of the laser beam positioned inside the primitive SiC ingot, to form a modified layer in which SiC is separated into silicon (Si) and carbon (C) and a crack extends along the c-plane, and the modified layer is observed from the planarized end surface to detect the c-plane.

10. The SiC ingot forming method according to claim 8, wherein after the first end surface forming step, a peripheral surface of the primitive SiC ingot is formed with a first orientation flat parallel to a direction in which the off angle is formed, and with a second orientation flat orthogonal to the first orientation flat on a right side of the first orientation flat as the primitive SiC ingot is viewed from the first end surface side.

11. The SiC ingot forming method according to claim 10, wherein the second orientation flat is formed to be shorter than the first orientation flat.

12. The SiC ingot forming method according to claim 8, wherein said predetermined off angle is 1°.

13. The SiC ingot forming method according to claim 8, wherein said predetermined off angle is 4°.

14. The SiC ingot forming method according to claim 8, wherein said predetermined off angle is 6°.

* * * * *